(12) United States Patent
Heitkamp (10) Patent No.: US 6,406,312 B1
(45) Date of Patent: Jun. 18, 2002

(54) CIRCUIT CARD CAPTIVATION AND EJECTION MECHANISM INCLUDING A LEVER TO FACILITATE REMOVAL OF THE MECHANISM FROM A HOUSING

(75) Inventor: Ross Suydam Heitkamp, Mountain View, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 09/840,981

(22) Filed: Apr. 25, 2001

(51) Int. Cl.[7] .................... H01R 13/62; H05K 5/00; H05K 5/04; H05K 5/06
(52) U.S. Cl. .................... 439/160; 439/157; 361/754
(58) Field of Search ................ 439/160, 157; 312/215, 218; 361/754

(56) References Cited

U.S. PATENT DOCUMENTS 5,628,637 A * 5/1997 Pecone et al. ............. 439/74
5,980,281 A * 11/1999 Neal et al. ................ 439/157
6,147,872 A * 11/2000 Roy ....................... 211/41.17
2001/0012712 A1 * 8/2001 Nishioka .................. 439/159

* cited by examiner

Primary Examiner—Brian Sircus
Assistant Examiner—Chandrika Prasad
(74) Attorney, Agent, or Firm—Harrity & Snyder L.L.P.

(57) ABSTRACT

A removable apparatus for carrying a circuit board includes a carrying plate having a notch to receive a stationary pin of an enclosure and a faceplate connected to one end of the carrying plate. A rotating cam connects to the carrying plate and acts on the pin to move the apparatus relative to the pin during insertion into and removal from the enclosure. The cam includes two different surfaces, each of which acts to move the apparatus either into or out of the enclosure. A linkage is connected to the cam and extends through the faceplate, connecting to a lever on the exterior of the faceplate. The lever is used to rotate the cam, which in conjunction with the pin provides translational motion either to mate a connector on the circuit board with a corresponding connector in the enclosure or to separate the mated connectors, depending on the direction of rotation.

44 Claims, 8 Drawing Sheets

Fig. 8 under the present invention is defined by the appended claims and equivalents.

CIRCUIT CARD CAPTIVATION AND EJECTION MECHANISM INCLUDING A LEVER TO FACILITATE REMOVAL OF THE MECHANISM FROM A HOUSING

BACKGROUND OF THE INVENTION

1. Field of the Invention

The present invention relates generally to a mechanism for holding a circuit board and, more particularly, to mechanisms for inserting and removing a circuit board to/from a housing.

2. Description of Related Art

Conventional electronic systems typically contain a number of similarly-functioning circuit boards, which may also be referred to as boards or cards. Such a system, shown in FIG. 1, includes a housing 100 containing a back plane, or some other electronic architecture (not shown), for receiving and interconnecting the cards. These cards conventionally plug into connectors located on a back plane or mid plane. The housing 100 typically contains a number of racks 110 to hold the cards. An example of such a system is a rack-mounted communication system which contains a number of communication interface cards.

Figure 1:
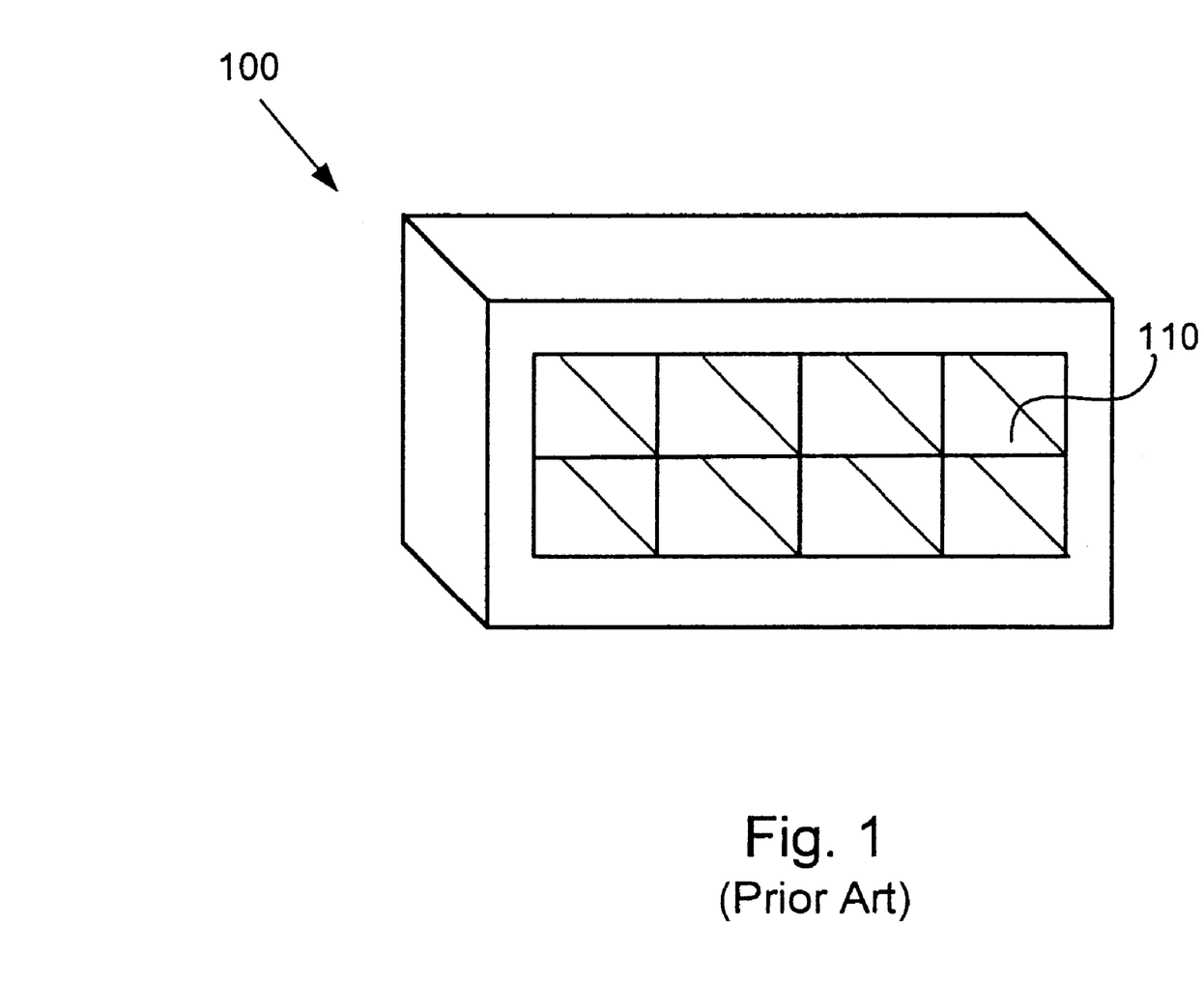
FIG. 1 is a perspective view of a conventional housing for holding a number of circuit cards.

Each circuit card is typically affixed to a card carrier, that fits into corresponding receiving hardware (not shown) in the housing 100. The receiving hardware facilitates card insertion and retention. One way of configuring such a system is to screw or bolt the card carrier onto the receiving hardware, after the circuit card's connector has been inserted into a corresponding connector. In this manner, the screw or bolt prevents the two connectors from becoming disconnected via vibration, insertion or removal of adjacent cards, etc. To enclose the card carrier, a faceplate is typically used, which may attach to the card carrier, or directly to the housing 100. Such faceplates may have holes for connectors to extend through to connect to wires or cables, and transparent windows for indicator lights or other visual displays.

Another way of configuring an electronics system recognizes that cards may need to be replaced with some frequency. For example, so-called hot-swappable cards and interfaces allow insertion and removal of cards without turning off the power to the electronics system. In such an arrangement, the receiving hardware in the housing 100 typically includes a slot for guiding and aligning the card carrier. The card carrier is pushed into the slot until the card's connector and the corresponding connector on the back plane or mid plane are in firm contact. Typically, the faceplate must be inserted with such force that the card cannot be moved into the housing any further. The faceplate in this arrangement typically includes a handle or gripping surface, so that a technician can pull the card back out when desired.

This conventional arrangement, however, relies on an operator to determine by "feel" when insertion is complete. Also, a small handle on a faceplate may be insufficient to overcome the holding friction of the card's connector. In both the insertion and removal scenarios, the operator may be required to "jiggle" or jar the card carrier to obtain complete insertion or removal of the card. Such fiddling increases the time needed to swap cards and does not guarantee fall card insertion. It may also increase the likelihood of bent connector pins and other damage to the circuit card. Also, the card is only held in place by the friction of its connector with the corresponding receiving connector. When vibration or other jarring occurs, cards held in place by friction may become unseated and lose proper electrical connection.

As a result, a need exists for a card carrier that facilitates insertion and removal, while securely retaining the card once it has been inserted.

SUMMARY OF THE INVENTION

Systems and methods consistent with the present invention address this and other needs via circuit card carriers that facilitate the insertion and removal of corresponding circuit cards into and out of a housing.

In accordance with the purpose of the invention as embodied and broadly described herein, a removable apparatus for carrying a circuit board includes a carrying plate having a notch to receive a stationary pin and a faceplate connected to one end of the carrying plate. A cam is connected to the carrying plate to rotate and act on the pin to move the apparatus relative to the pin. A linkage is connected to the cam and extends through the faceplate, connecting to a lever on an opposite side of the faceplate from the cam that facilitates insertion and removal of the apparatus from a housing.

In another implementation consistent with the present invention, a circuit card carrier for insertion into and removal of a circuit card from an enclosure having a stationary pin includes a carrying plate having a notch therein to receive the stationary pin. A cam is connected to the carrying plate so that it may rotate, and the cam has a first surface to act on the pin during removal and a second surface to act on the pin during insertion. A linkage is connected to the cam and to an actuator. Movement of the actuator in conjunction with the linkage rotates the cam to facilitate insertion and removal of the carrier from the enclosure.

BRIEF DESCRIPTION OF THE DRAWINGS

The accompanying drawings, which are incorporated in and constitute a part of this specification, illustrate embodiments of the invention and, together with the description, explain the invention. In the drawings.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims and equivalents.

Card carriers consistent with the present invention include a rotating cam having three surfaces which alternately act on a stationary pin in a housing to facilitate insertion, removal, and retention of a circuit card. The cam is rotated by a lever or handle on the front of a faceplate that is attached to the card carrier to securely insert the circuit card into the housing and ease the removal of the circuit card.

Figure 2:
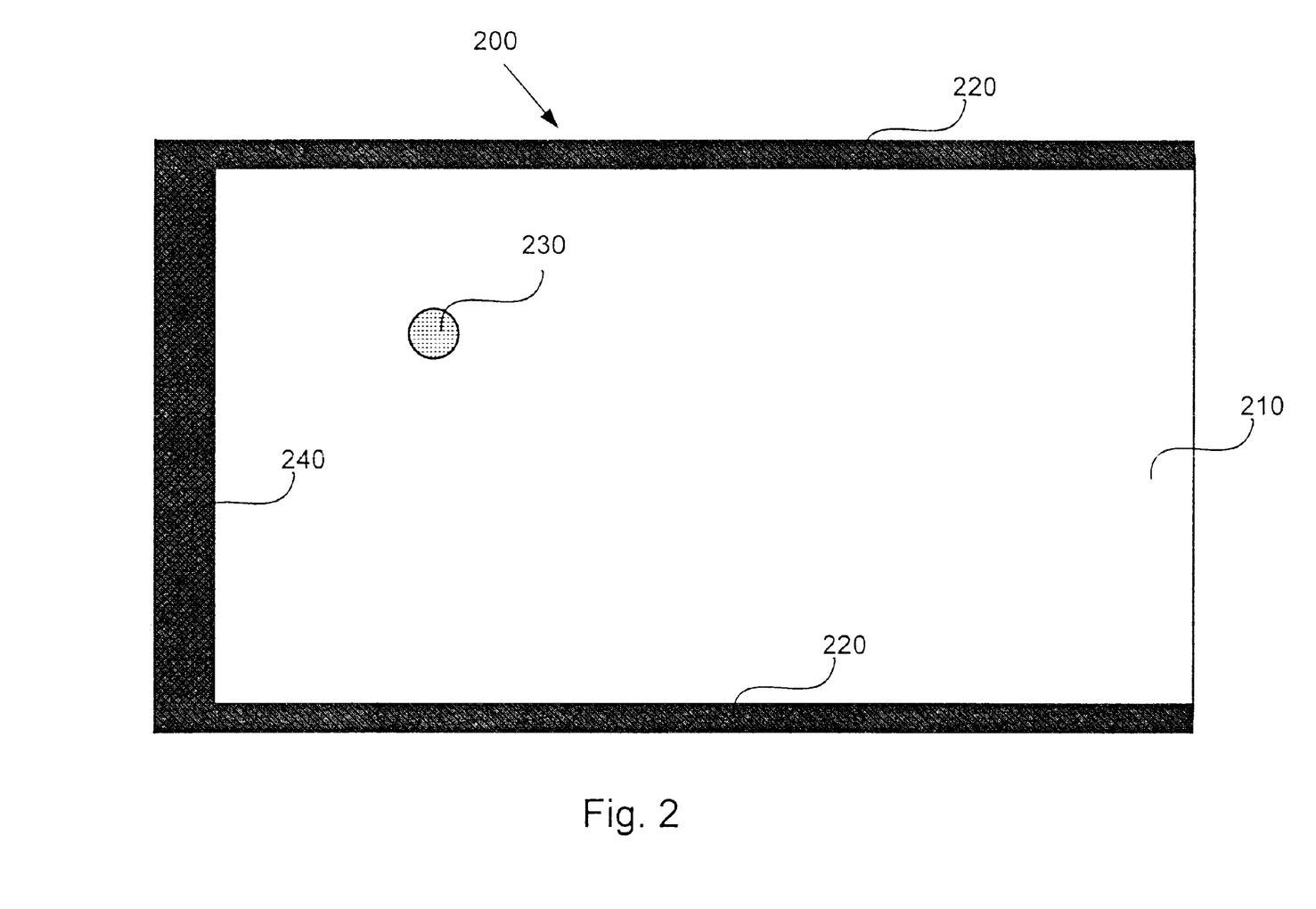
FIG. 2 is a plan view of receiving hardware according to an implementation consistent with the present invention.

FIG. 2 shows a plan view of receiving hardware 200 consistent with the present invention that may be located in the housing 100. This hardware 200 includes a base plate 210, which is connected to a pair of guides 220 for aligning and guiding a card carrier during insertion. The base plate 210 is also fixedly connected to an actuator pin 230. This actuator pin 230 provides a stationary surface for the card carrier to act upon (i.e., to push against) to aid in its insertion and removal. As seen in the plan view of FIG. 2, the actuator pin 230 extends vertically out of the page. The hardware 200 may also include a connector 240 mounted on a back plane, mid plane, or bulkhead to electrically connect the circuit card with other electronics in the enclosure.

Figure 3:
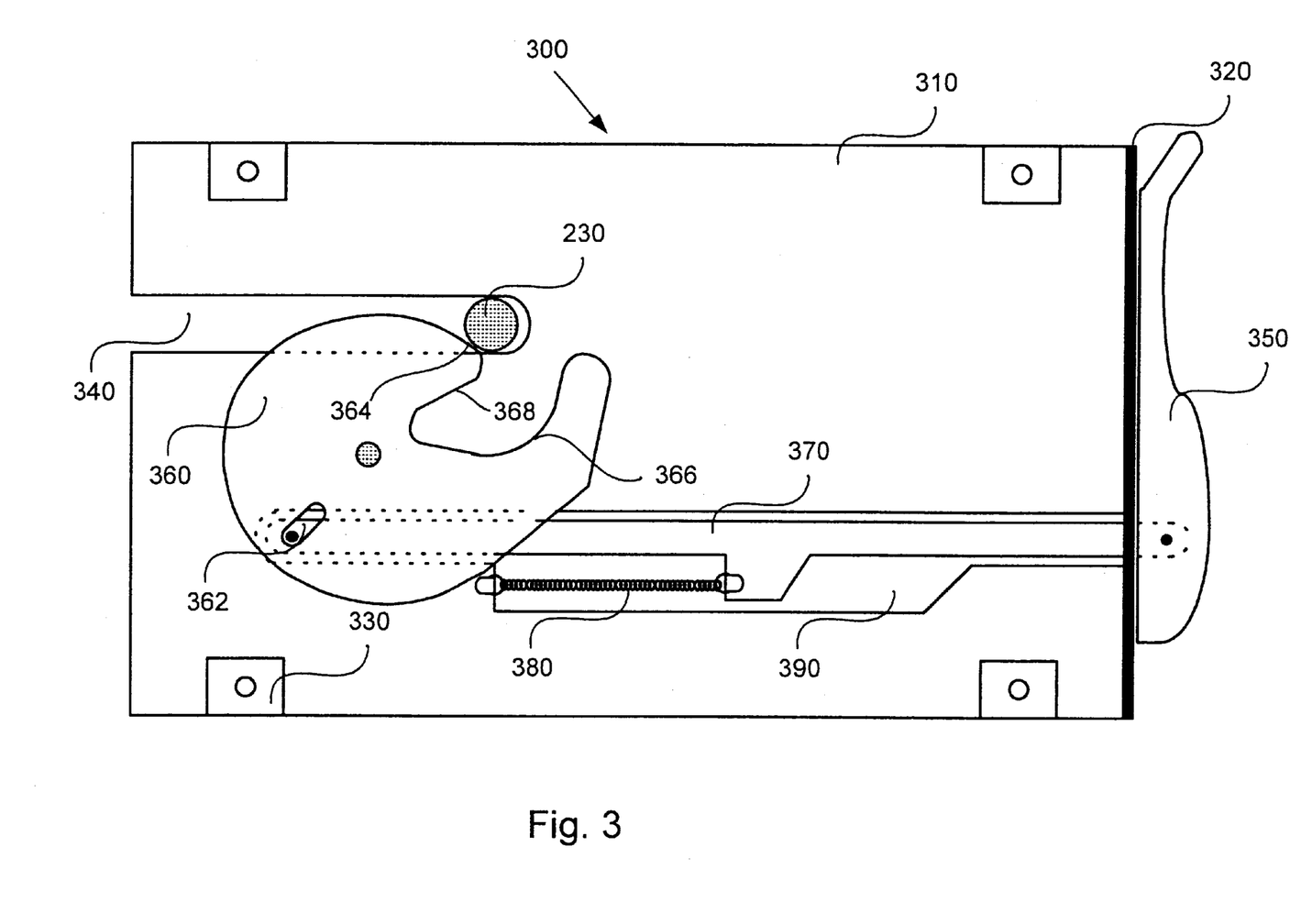
FIG. 3 a plan view of a circuit card carrier that is fully inserted into a housing.

FIG. 3 shows a circuit card carrier 300 which includes a carrier/guide plate 310 connected at one end to a faceplate 320. The plate 310 includes a number of protrusions 330 at its corners for holding a circuit card (e.g., 800 in FIG. 8). These protrusions 330 may extend above the plane of the plate 310 to hold the circuit card 800 away from the rest of the carrier 300. The plate 310 has a receiving slot 340 opposite the faceplate 320 for receiving the actuator pin 230 from the receiving hardware 200.

The card carrier 300 also includes a faceplate-mounted ejection lever 350 connected to an ejector cam piece 360 by a fixed-length linkage 370. The lever 350 is rotatably connected to the linkage 370 by a pivot, which may be a rivet, or other known connector that allows rotation.

The cam 360 is rotatably connected to the carrier plate 310 by a pivot that allows the cam to rotate. The cam 360 includes a slot 362, a tangential surface 364, a first radial surface 366, and a second radial surface 368. A portion of the linkage 370 extends through the slot 362 in the cam 360 to rotate the cam. The slot 362 allows linear movement of the linkage 370 to be smoothly converted into rotational movement of the cam 360. The tangential surface 364 and the first and second radial surfaces 366 and 368 operate in conjunction with the actuator pin to move the card carrier 300 and hold the card carrier 300 securely within the housing 100.

A spring 380 is connected between the linkage 370 and the carrier plate 310. The spring 380 provides a force to hold the lever 350 against the faceplate 320 and to hold the cam 360 against the actuator pin 230. The plate 310 includes a slot 390 in which the linkage 370 and the spring 380 are located, so as to decrease the thickness of the carrier 300. Because the linkage 370 is co-planar with the carrier plate 310, the carrier 300 may be thin, requiring a width of two pieces of metal—one for the carrier plate 310 and one for the cam 360. Indeed, the spring 390 may be the widest portion of the carrier 300, excluding the faceplate 320 and the protrusions 330. The protrusions 330 need only translate the circuit board a few millimeters to clear all of the moving parts of the carrier 300.

It will be apparent to those skilled in the enclosure art that the carrier plate 310, the faceplate 320, the linkage 370, and the cam 360 may all be made of metal, for example sheet metal, one to several millimeters thick. Methods of manufacturing and assembling such components are known to those skilled in the art. The lever 350 is more substantial, and, while it also may be made of metal, it may be manufactured by machining or casting. FIGS. 2 and 3 have been thus far described as "plan" views. The true nature of these views depends on the desired orientation of the circuit card. If the card is to be oriented vertically, then FIGS. 2 and 3 are side views; if the card is to be oriented horizontally, then these figures are top views.

Figure 4:
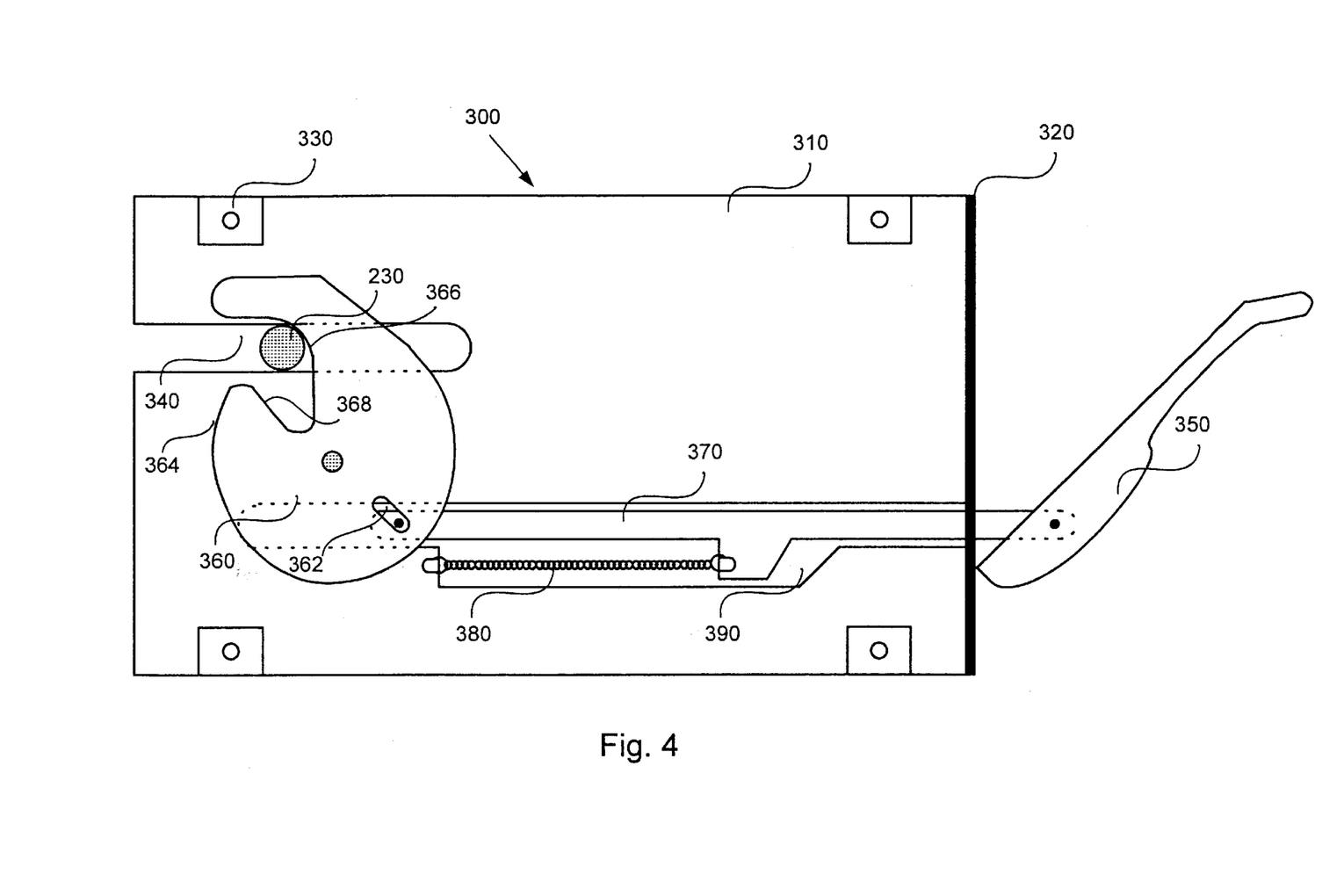
FIG. 4 is a plan view of the circuit card carrier of FIG. 3, which is shown just prior to insertion or just after removal.

With reference to FIGS. 3 and 4, the function of the cam 360 will now be explained. FIGS. 3 and 4 show the two extreme (i.e., fully rotated) positions of the cam 360. When the card carrier 300 is to be inserted in a housing, the lever 350 is first fully extended, as shown in FIG. 4, to fully rotate the cam 360. When the carrier 300 is inserted in this position, the actuator pin 230 first comes in contact with the first radial surface 366 of the cam 360. When the carrier 300 and/or the lever 350 is pushed inward, the combination of the spring 380 and the movement of the lever 350 translated by the linkage 370 cause the cam 360 to rotate. Upon such rotation, the second radial surface 368 of the cam 360 comes in contact with the actuator pin 230, forcing the pin deeper into the receiving slot 340 of the carrier plate 310. At the end of insertion, the tangential surface 364 of the cam 360 locks the carrier plate 310 in position. In this manner, the rotation of the cam 360 moves the card carrier 300 inward relative to the stationary actuator pin 230, thereby fully engaging the connector (e.g., 820 in FIG. 8) of the circuit card 800 with a corresponding receiving connector (not shown) on a back plane or mid plane in the housing.

Once fully engaged, the spring 380 in combination with the tangential surface 364 maintains the cam 360 against the actuator pin 230 to ensure that the card remains fully connected through any subsequent vibration or other small movements. Because the actuator pin 230 rests against the tangential surface 364, any force (e.g., a vibration or shock) that is applied to the cam 360 by the actuator pin 230 in this position does not rotate the cam. Hence, the presence of the tangential surface 364 produces a much higher holding force for the card carrier 300 than the spring 380 alone.

When the card carrier 300 is to be removed from the housing, the lever 350 is pulled from the initial position shown in FIG. 3. The linkage 370 causes the cam 360 to rotate, thereby disengaging the tangential surface 364 of the cam 360 from the actuator pin 230. Through rotation of the cam 360, the first radial surface 366 contacts the actuator pin 230, and operates to move the card carrier 300 outward with respect to the actuator pin 230. The lever 350 provides enough mechanical advantage to overcome any initial contact friction of the card's connector, and allows the card to be removed with a uniform and steady motion. In the implementation shown, the lever 350 is not connected to the faceplate 320. Rather, near the end of the lever's pull (see FIG. 4), one end of the lever slides along the faceplate until coming in contact with the linkage 370, to provide additional translation of the linkage 370. Once the lever 350 is in a fully extended position as shown in FIG. 4, the connector of the card (not shown) may be completely disengaged, and the card carrier 300 may be easily pulled out of the housing. Once removed, the spring 380 will bring the cam 360 and the lever 350 back to the positions shown in FIG. 3.

Figure 5:
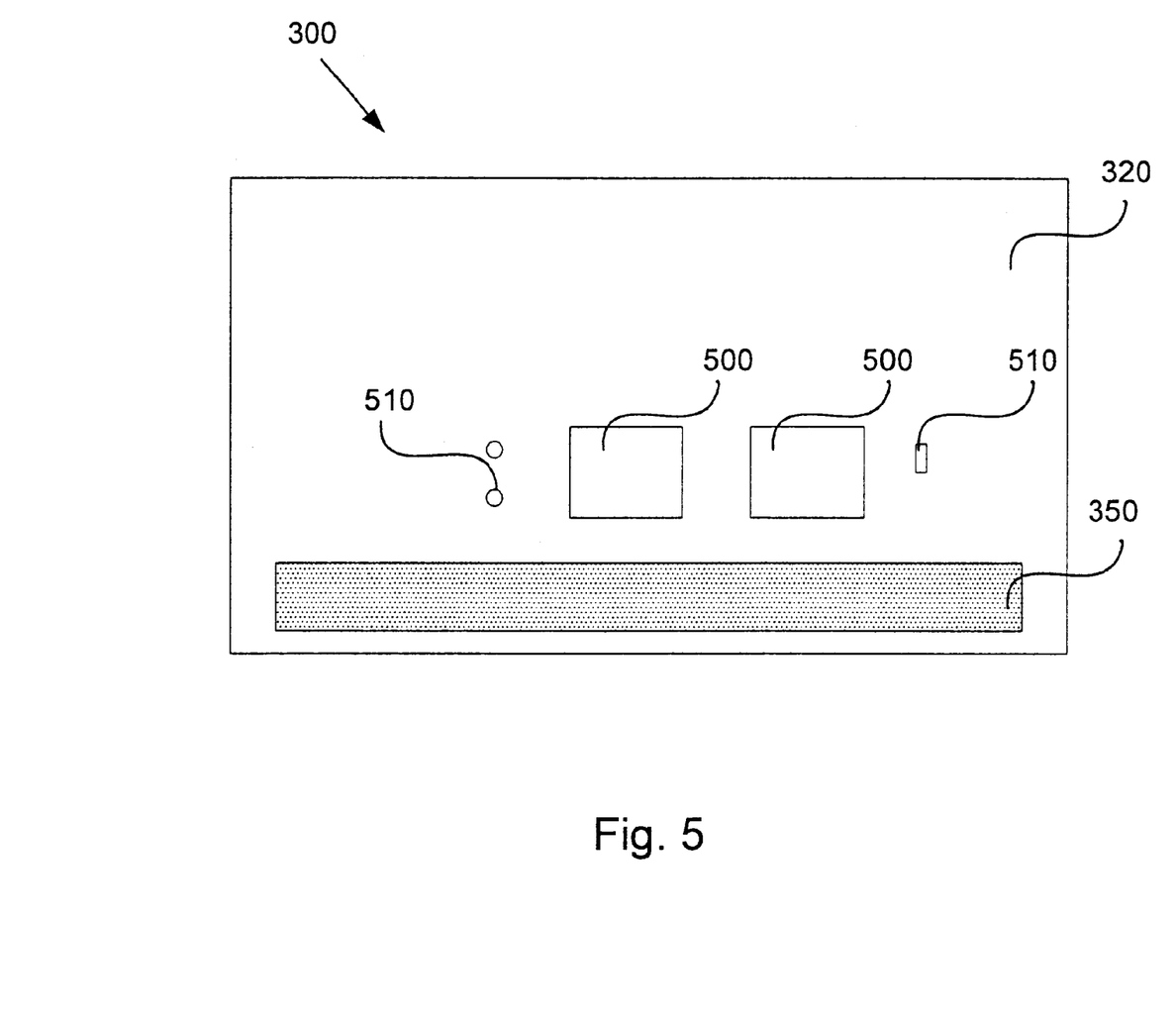
FIG. 5 is a front view of the circuit card carrier of FIG. 3.

FIG. 5 shows a front view of the card carrier 300, in which the lever 350 is located along one side of the faceplate 320. The lever 350 is connected to the linkage 370 (not shown), which extends through a hole in the faceplate 320. The faceplate 320 also may contain a number of holes 500, through which connectors on the circuit card may extend. Also illustrated are several indicators or displays 510 in the faceplate 320, that may provide information regarding the operation of the circuit card. An example of such an indicator is a light emitting diode (LED), which may be fabricated in various shapes and sizes.

Figure 6:
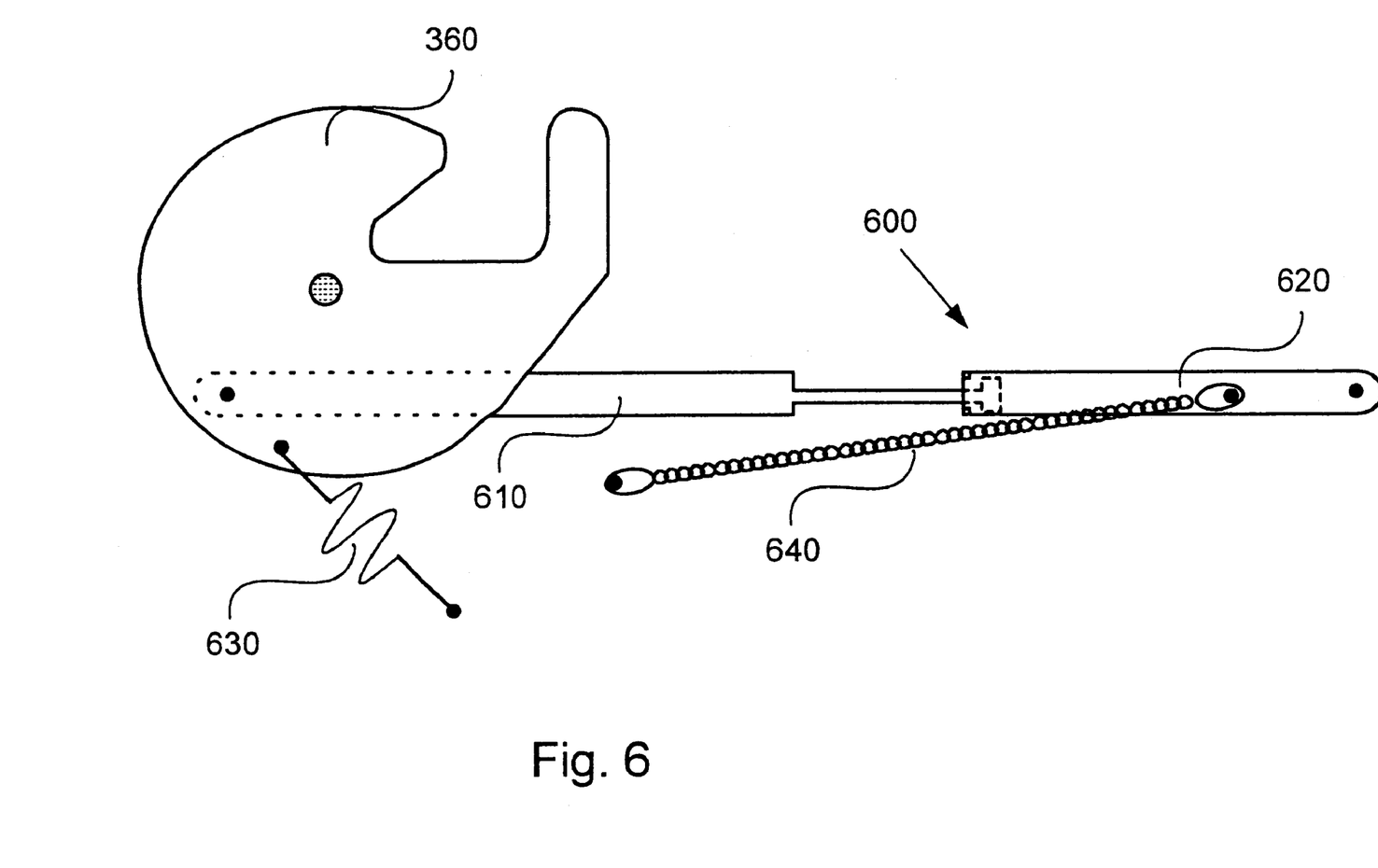
FIG. 6 is a plan view of a variable-length actuation arrangement consistent with the present invention.

FIG. 6 shows an alternate embodiment of the cam-actuating hardware according to an implementation consistent with the present invention. Instead of the fixed-length linkage 370 shown in FIGS. 3 and 4, a two-piece, variable-length linkage 600 may be used. The first portion 610 of this linkage connects to the cam 360 and translates within the second portion 620 until its relative movement is arrested. In one direction, the larger width section of the first portion 610 abuts the end of the second section 620, resulting in the linkage 600 having its shortest length. In an opposite direction, the end of the first portion 610 abuts an internal stop of the second section 620, resulting in the linkage 600 having its longest length. The variable-length linkage has the advantage that the lever 350 need not be extended when the cam 360 is fully rotated as shown, e.g., in FIG. 4. A spring 640 connected between the second section 620 and the carrier plate (not shown) operates to retract the second section 620 when the handle is released.

In conjunction, another spring 630 may be employed to make the cam 360 bi-stable, i.e., stable in two positions. This spring 630 may include a bi-stable spring or a second spring to be used with the previously-described spring 380 (not shown). An advantage of such a bi-stable configuration is that an operator is not required to hold the lever 350 extended during insertion.

Figure 7:
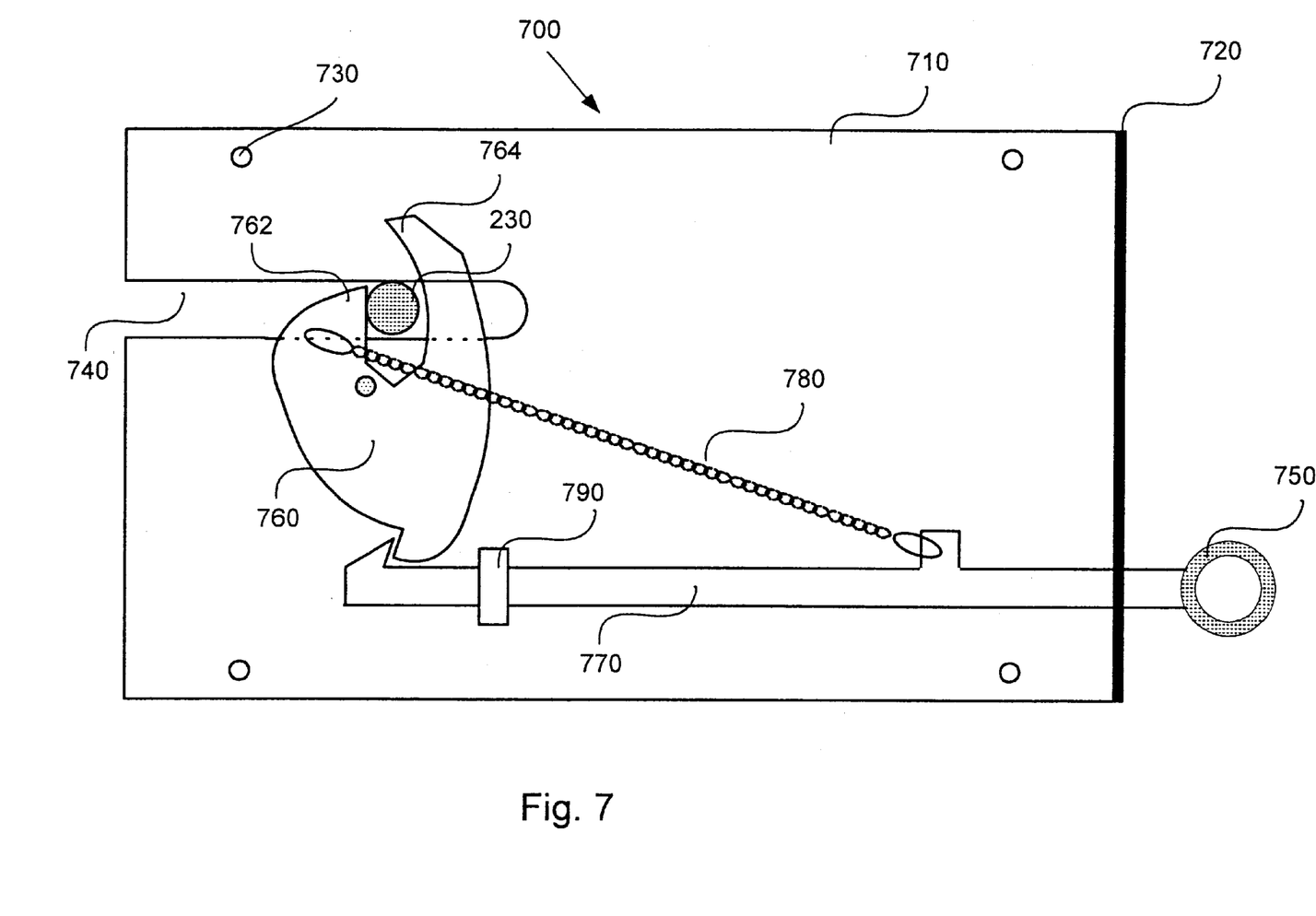
FIG. 7 is a plan view of a circuit card carrier according to another implementation consistent with the invention.

FIG. 7 shows a circuit card carrier 700 which includes a carrier/guide plate 710 connected at one end to a faceplate 720. The plate 710 includes a number of protrusions 730 at its corners for holding a circuit card (not shown). These protrusions 730 extend above the plane of the plate 710, to hold the circuit card away from the rest of the carrier 700. The plate 710 has a receiving slot 740 opposite the faceplate 720 for receiving the actuator pin 230.

The card carrier 700 also includes an ejection handle 750 which acts on an ejector cam piece 760 by a fixed-length linkage 770. The handle 750 is fixedly connected to the linkage 770. A retaining strap 790 holds the linkage 770 against the plate 710, while allowing the linkage 770 to translate back and forth.

The cam 760 is rotatably connected to the carrier plate 710 by a pivot that allows the cam to rotate. The cam 760 includes a smaller extending portion 762 and a larger extending portion 764. A portion of the linkage 770 acts on the bottom portion of the cam 760 to rotate the cam. The extending portions 762 and 764 may operate in conjunction with the pin 230 to facilitate the insertion and removal of the carrier 700 into and out of the housing. A spring 780 is connected between the linkage 770 and the cam 760. The spring 780 provides a force to hold the cam 760 against the actuator pin 230. The spring 780 provides a bi-stable force on the cam 760 to maintain it in either the open or closed position, as well as providing a return force for the handle 750 to the closed position. The bi-stable spring 780 allows insertion of the carrier 700 without having to hold the handle 750 extended from the faceplate 720.

The operation of the carrier 700 is similar to that described above with regard to FIGS. 3 and 4. The smaller extending portion 762 and the larger extending portion 764 act on the pin 230 to respectively insert and remove the card carrier 700. However, because the linkage 770 is not connected to the cam 760, it can directly rotate the cam only when ejecting the carrier (i.e., when the handle 750 is pulled). Such an arrangement, however, retains the advantage of overcoming the holding friction between the card's connector and the corresponding connector on the back plane of mid plane of the housing. Further, the cam 760 may be designed to have a greater mechanical advantage than, e.g., the cam 360, because the total travel of the linkage 770 is not limited by the handle 750 contacting the faceplate 720.

Figure 8:
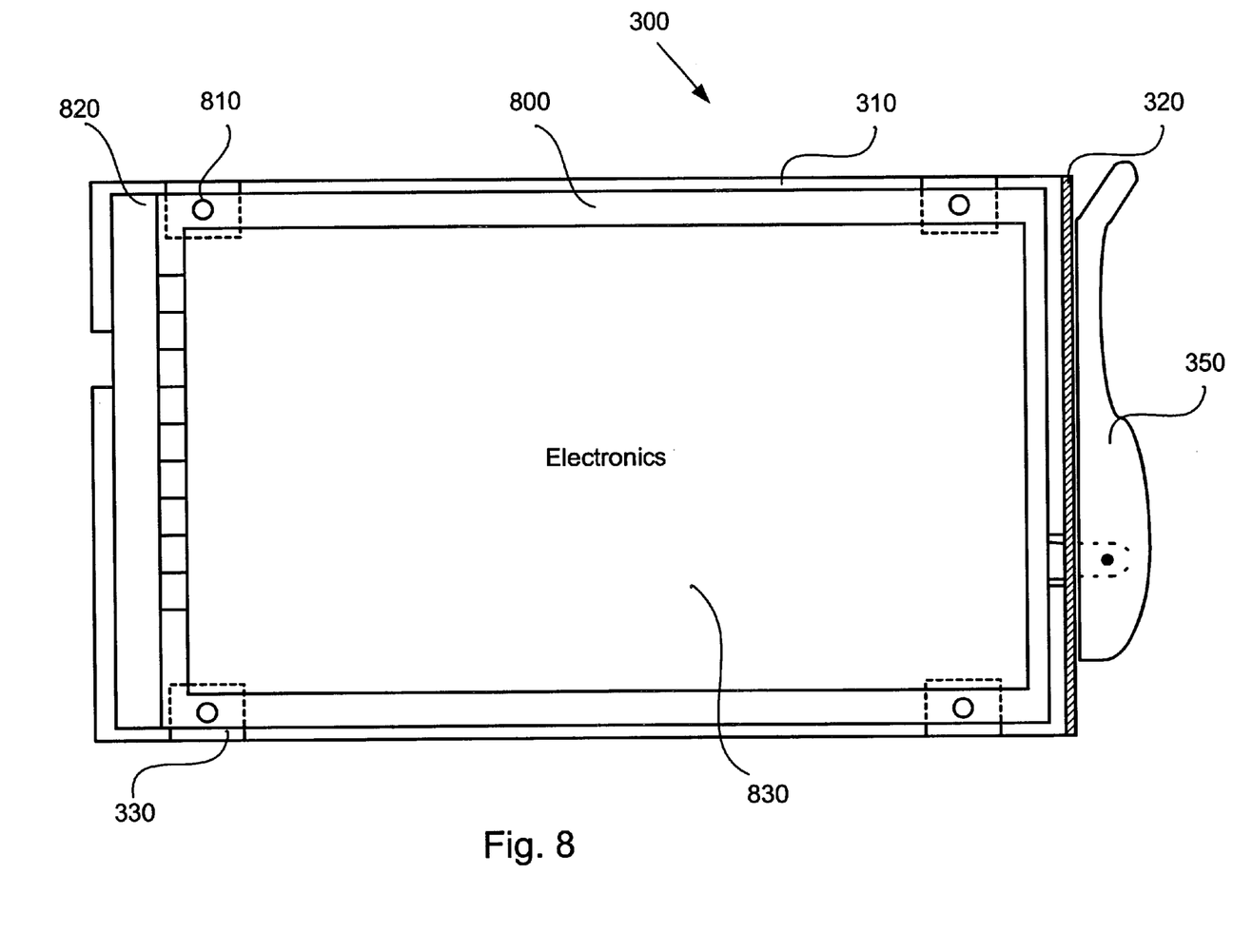
FIG. 8 is a plain view of a circuit card attached to the circuit card carrier of FIG. 3.

The circuit card 800, shown in FIG. 8 attached to the protrusions 330 of the card carrier 300 by fasteners 810, may include an interface card 830 configured to interface with a physical link in a network device, such as a switch or router. Each physical link could be one of many types of transport media, such as optical fiber or Ethernet cable. The data on the physical link is formatted according to one of several protocols, such as the synchronous optical network (SONET) standard, an asynchronous transfer mode (ATM) technology, or Ethernet. The interface card 830 includes interfacing, processing, and memory elements necessary to transmit data between a wide area network (WAN) physical link and the remainder of the network device. For incoming data, the interface card 830 may convert from an optical to an electrical signal (if necessary), strip off layer 1 (L1) protocol information and forward the remaining data, raw packets, to the remainder of the network device. For outgoing data, the interface card 830 may receive packets from the remainder of the network device, encapsulate the packets in L1 protocol information, and transmit the data on the physical WAN link. The circuit card 800 attached to the card carrier 300 may also include other types of removable cards (e.g., modems, telephony cards, or processing cards) that are configured to provide interfacing or processing capabilities to a receiving, perhaps modular, device.

It will be apparent to those skilled in the art that various modifications and variations can be made in the card carrier of the present invention without departing from the spirit or scope of the invention. For example, a hinge can be added to attach the ejection lever 350 to the faceplate 320, thereby improving the lever's ability to aid during insertion. Alternately, a handle, ring, or other component may be used to move the linkage 370 instead of a lever. Also, the shape of the cam 360 can be made more spiraled in the latching area of the cam. Additional spiral would give enhanced force for insertion of the card carrier. Further, though the faceplate 360 was shown with one or more openings 500, it may also contain no openings. Moreover, it is specifically envisioned that various components and features of the different implementations described may be interchanged and combined to suit a particular set of design requirements. Thus, it is intended that the present invention cover the modifications and variations of the this invention provided that they come within the scope of the appended claims and their equivalents.

What is claimed is:

1. A removable apparatus for carrying a circuit board, comprising:
   a carrying plate having a notch therein to receive a stationary pin;
   a faceplate connected to one end of the carrying plate;
   a cam rotatably connected to the carrying plate to act on the pin and move the apparatus relative thereto;
   a linkage connected to the cam and extending through the faceplate; and
   a lever on an opposite side of the faceplate from the cam and the carrying plate and connected to the linkage to rotate the cam.

2. The apparatus of claim 1, wherein the cam includes first, second, and third surfaces, the first surface being configured to move the apparatus in a first direction, the second surface being configured to move the apparatus in a second direction, and the third surface being configured to retain the apparatus when fully inserted into the housing.

3. The apparatus of claim 2, wherein the first direction is opposite to the second direction.

4. The apparatus of claim 2, wherein the first surface contacts the pin when the cam rotates in one direction, the second surface contacts the pin when the cam rotates in another direction, and the third surface contacts the pin upon complete insertion.

5. The apparatus of claim 2, wherein when the lever is fully extended, the first surface contacts the pin, and when the lever is fully retracted, the third surface contacts the pin.

6. The apparatus of claim 1, wherein the notch is located on an opposite side of the carrying plate from the faceplate.

7. The apparatus of claim 1, further comprising:
a spring connected between the carrying plate and the linkage to hold the lever against the faceplate and to hold the cam against the pin.

8. The apparatus of claim 1, wherein the faceplate contains at least one opening through which electrical connection to the circuit board may be obtained.

9. The apparatus of claim 1, wherein the carrying plate includes a plurality of protrusions for supporting the circuit board away from the cam and the linkage.

10. The apparatus of claim 1, wherein the linkage includes two pieces slidably connected so that the linkage has a variable length.

11. A circuit card carrier for insertion and removal of a circuit card into and from an enclosure, the enclosure including a stationary pin and the circuit card having a connector, the carrier comprising:
a carrying plate having a notch therein to receive the stationary pin;
a cam rotatably connected to the carrying plate and including a first surface to act on the pin during removal;
a linkage connected to the cam; and
an actuator connected to the linkage, the actuator being moveable to rotate the cam to facilitate removal of the carrier from the enclosure.

12. The carrier of claim 11, wherein the first surface is concave with respect to the pin and the second surface is convex with respect to the pin.

13. The carrier of claim 11, wherein movement of the first surface against the pin provides insertion force to overcome insertion friction of the circuit card connector.

14. The carrier of claim 11, wherein movement of the second surface against the pin provides removal force to overcome holding friction of the circuit card connector when it is mated with a corresponding connector in the enclosure.

15. The carrier of claim 11, wherein the first surface contacts the pin when the cam rotates in one direction and the second surface contacts the pin when the cam rotates in another direction.

16. The carrier of claim 11, further comprising:
a faceplate connected to one end of the carrying plate.

17. The carrier of claim 11, further comprising:
a spring connected between the carrier plate and the linkage to hold the cam against the pin when the carrier is inserted.

18. The carrier of claim 16, wherein the faceplate contains at least one opening through which electrical connection to the circuit card may be obtained.

19. The carrier of claim 11, wherein the carrying plate includes a plurality of protrusions for supporting the circuit card away from the cam and the linkage.

20. The carrier of claim 11, wherein the linkage includes two pieces slidably connected so that the linkage may vary in length.

21. The carrier of claim 11, wherein the actuator is a lever.

22. The carrier of claim 11, wherein the actuator is a handle.

23. The apparatus of claim 2, wherein the cam is rotatably connected to the carrying plate by a connector, and
wherein the first and second surfaces extend along first and second radial directions with respect to the connector, and
wherein the third surface extends along a direction perpendicular to one of the first and second radial directions.

24. The carrier of claim 11, wherein the cam further includes:
a third surface configured to retain the carrier when the carrier is fully inserted into the enclosure.

25. The carrier of claim 24, wherein the cam is rotatably connected to the carrying plate by a connector, and
wherein the first and second surfaces extend along first and second radial directions with respect to the connector, and
wherein the third surface extends along a direction perpendicular to one of the first and second radial directions.

26. A manufacture to aid removal from an enclosure, comprising:
a circuit board with circuitry thereon; and
a mechanical apparatus configured to provide mechanical assistance to aid removal of the circuit board when actuated by a user, the mechanical apparatus including:
a cam that is rotatable by the user and that includes a first surface that acts on the enclosure during rotation in a first direction to aid insertion of the circuit board, a second surface that acts on the enclosure during rotation in a second direction to aid removal of the circuit board, and a third surface that acts on the enclosure when the circuit board is fully inserted to prevent movement of the circuit board.

27. The manufacture of claim 26, wherein the mechanical apparatus further includes:
an actuator that is coupled to the cam and that is movable by the user to rotate the cam in the first and second directions.

28. The manufacture of claim 26, wherein the circuitry includes:
first circuitry on the circuit board configured to convert a received optical signal into an electronic signal that represents data packets.

29. The manufacture of claim 28, wherein the circuitry further includes:
second circuitry on the circuit board configured to process the electronic signal that represents data packets.

30. A method of inserting and removing a circuit board from an enclosure, comprising:
rotating a cam in a first direction so that a first surface of the cam acts on the enclosure to propel the circuit board into the enclosure; and
rotating the cam in a second direction so that a second surface of the cam acts on the enclosure to propel the circuit board out of the enclosure,
wherein said rotating a cam in a first direction includes:
fully rotating the cam in the first direction so that a third surface of the cam, which is oriented differently from the first surface and the second surface, acts on the enclosure to retain the circuit board in the enclosure.

31. The method of claim 30, wherein said rotating a cam in a first direction includes:
  moving an actuator that is coupled to the cam in a linear or rotational manner.

32. The method of claim 31, wherein said rotating a cam in a second direction includes:
  moving the actuator that is coupled to the cam in another linear or rotational manner.

33. The apparatus of claim 1, wherein rotation of the cam by the lever facilitates both insertion and removal of the apparatus from a housing.

34. The apparatus of claim 1, wherein rotation of the cam by the lever facilitates removal of the apparatus from a housing.

35. The carrier of claim 11, wherein the cam further includes a second surface to act on the pin during insertion, and
  wherein the actuator is moveable to rotate the cam to facilitate insertion of the carrier into the enclosure.

36. An apparatus for carrying a circuit board, comprising:
  a carrying plate having a notch therein to receive a stationary pin;
  a faceplate connected to one end of the carrying plate;
  a mechanism connected to the carrying plate to act on the stationary pin and move the carrying plate relative thereto;
  a linkage connected to the mechanism and extending through the faceplate; and
  an actuator on an opposite side of the faceplate from the mechanism and connected to the linkage to move the mechanism.

37. The apparatus of claim 36, wherein the stationary pin is connected to a housing that is configured to receive the apparatus, and
  wherein movement of the actuator in a first direction causes the mechanism to act on the stationary pin to move the apparatus out of the housing.

38. The apparatus of claim 36, wherein the stationary pin is connected to a housing that is configured to receive the apparatus, and
  wherein movement of the actuator in a second direction causes the mechanism to act on the stationary pin to move the apparatus into the housing.

39. The manufacture of claim 26, wherein the mechanical apparatus is connected to the circuit board.

40. The manufacture of claim 26, wherein the mechanical apparatus is configured to provide mechanical assistance to aid both insertion and removal of the circuit board when actuated by a user.

41. The manufacture of claim 26, wherein the third surface is oriented substantially orthogonally to a radius of the cam.

42. The apparatus of claim 1, wherein the stationary pin is within the notch and within a perimeter of the carrying plate when acted upon by the cam.

43. The carrier of claim 11, wherein the stationary pin is within the notch and within a perimeter of the carrying plate when acted upon by the cam.

44. The apparatus of claim 36, wherein the stationary pin is within the notch and within a perimeter of the carrying plate when acted upon by the mechanism.

* * * * *